United States Patent
Ku et al.

(10) Patent No.: US 11,062,759 B1
(45) Date of Patent: Jul. 13, 2021

(54) MEMORY DEVICE AND PROGRAMMING METHOD THEREOF

(71) Applicant: MACRONIX INTERNATIONAL CO., LTD., Hsinchu (TW)

(72) Inventors: Shaw-Hung Ku, Hsinchu (TW); Cheng-Hsien Cheng, Yunlin County (TW); Atsuhiro Suzuki, Hsinchu (TW); Yu-Hung Huang, Tainan (TW); Sheng-Kai Chen, New Taipei (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/837,041

(22) Filed: Apr. 1, 2020

(51) Int. Cl.
| | |
|---|---|
| *G11C 11/408* | (2006.01) |
| *G11C 11/4074* | (2006.01) |
| *G11C 11/56* | (2006.01) |
| *G11C 11/409* | (2006.01) |
| *G11C 11/4076* | (2006.01) |

(52) U.S. Cl.
CPC ........ *G11C 11/4085* (2013.01); *G11C 11/409* (2013.01); *G11C 11/4074* (2013.01); *G11C 11/4076* (2013.01); *G11C 11/5628* (2013.01)

(58) Field of Classification Search
CPC .................................................. G11C 11/4085
See application file for complete search history.

(56) References Cited

U.S. PATENT DOCUMENTS

| | | | | |
|---|---|---|---|---|
| 9,286,994 | B1* | 3/2016 | Chen | G11C 16/0483 |
| 2005/0276108 | A1* | 12/2005 | Guterman | G11C 16/10 |
| | | | | 365/185.18 |
| 2008/0084747 | A1* | 4/2008 | Hemink | G11C 16/3427 |
| | | | | 365/185.18 |
| 2008/0159004 | A1* | 7/2008 | Hemink | G11C 16/3418 |
| | | | | 365/185.25 |
| 2011/0026331 | A1* | 2/2011 | Dong | G11C 16/0483 |
| | | | | 365/185.19 |
| 2013/0322179 | A1 | 12/2013 | Huang et al. | |
| 2016/0148691 | A1* | 5/2016 | Rabkin | G11C 16/10 |
| | | | | 365/185.19 |
| 2017/0062068 | A1 | 3/2017 | Rabkin et al. | |

* cited by examiner

*Primary Examiner* — Douglas King
(74) *Attorney, Agent, or Firm* — McClure, Qualey & Rodack, LLP

(57) ABSTRACT

A memory device and a programming method thereof are provided. The memory device includes a memory array, a plurality of word lines and a voltage generator. During a programming procedure, one of the word lines is at a selected state and others of the word lines are at a deselected state. Some of the word lines, which are at the deselected state, are classified into a first group and a second group. The first group and the second group are respectively located at two sides of the word line, which is at the selected state. The voltage generator provides a programming voltage to the word line, which is at the select state, during a programming duration. The voltage generator provides a first two-stage voltage waveform to the word lines in the first group and provides a second two-stage voltage waveform to the word lines in the second group.

18 Claims, 8 Drawing Sheets

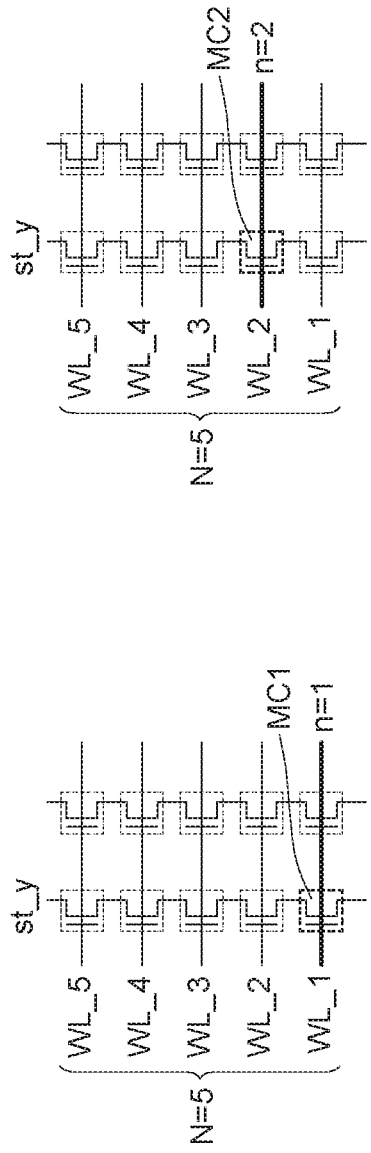
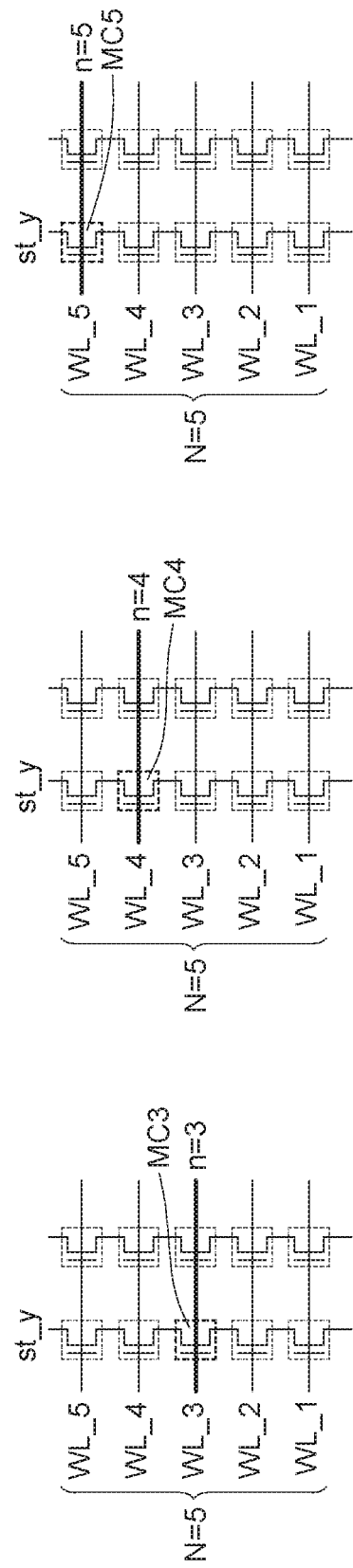
FIG. 6A  FIG. 6B  FIG. 6C  FIG. 6D  FIG. 6E

MEMORY DEVICE AND PROGRAMMING METHOD THEREOF

TECHNICAL FIELD

The disclosure relates in general to a semiconductor device and an operating method thereof, and more particularly to a memory device and a programming method thereof.

BACKGROUND

In embedded systems, non-volatile memories such as flash memories are typically used in electronic devices as storage media because the non-volatile memories can retain data even if power is off and consume relatively less power.

FIG. 1A is a block diagram illustrating a memory device. The memory device 10 includes a memory controller 11, a voltage generator 13, and a memory array 15. The memory array 15 includes a plurality of memory blocks 151, and each of the memory blocks 151 includes a plurality of sub-blocks 1511.

When the memory device 10 receives a write command from a host device, the memory controller 11 controls the voltage generator 13 to generate and provide a programming voltage Vpgm to a memory cell in the memory array 15. This memory cell is defined as being at a selected state. The sub-block includes the memory cell, which is at the selected state, is defined as being at the selected state, and the sub-blocks that do not include the memory cell, which is at the selected state, is defined as being at a deselected state.

FIG. 1B is a schematic diagram illustrating a memory block. The memory block 151 includes X sub-blocks 1511, and each of the X sub-blocks 1511 includes a plurality of memory strings 1511a. The sub-blocks 1511 include a sub-block sblk_x, which is at the selected state, and a plurality of sblk_1, sblk_(x+1), sblk_X, which is at the deselected state. The sub-block 1511 being selected for programming is represented as the sub-block sblk_x, which is at the selected state, wherein x and X are positive integers and 1≤x≤X. Each of the sub-blocks 1511 includes Y memory strings 1511a. For the sake of simplifying, only some of the memory strings 1511a are shown in FIG. 1B.

FIG. 2 is a schematic diagram illustrating a sub-block. The sub-block 1511 includes Y memory strings st_1~st_Y, and each of the Y memory strings st_1~st_Y includes a string selection cell SSC and a ground selection cell GSC. The gate terminals of the string selection cells SSC are jointly electrically connected to the source selection lines SSL, and the gate terminals of the ground selection cells GSC are jointly electrically connected to the ground selection line GSL.

The voltage level of the source selection line SSL represents whether the sub-block 1511 is the sub-block, which is at the selected state, or the sub-blocks, which is at the selected state. The source selection line SSL corresponding to the sub-block sblk_x, which is at the selected state, receives a supply voltage Vcc (for example, 3V), and the source selection lines SSL corresponding to the sub-blocks sblk_1~sblk_(x−1), sblk_(x+1)~sblk_X, which is at the selected state, receive a ground voltage.

The string selection cells SSC in the sub-block sblk_x, which is at the selected state, are turned on. The turned on string selection cells in the sub-block, which is at the selected state, then receive a ground voltage through bit lines, and channels with ground voltage are formed along the memory strings st_1~st_Y in the sub-block sblk_x, which is at the selected state. The channels in the sub-block sblk_x, which is at the selected state, are defined as ground channels.

On the other hand, the string selection cells SSC in the sub-blocks sblk_1, sblk_(x+1), sblk_X, which is at the deselected state, are turned off, and the channels of the memory stings in the sub-blocks sblk_1, . . . , sblk_(x+1), . . . , sblk_X, which is at the deselected state, are floating. The channels in the sub-blocks sblk_1, . . . , sblk(x+1), . . . , sblk_X, which is at the deselected state, are defined as floating channels.

As shown in FIG. 2, each of the memory strings st_1~st_Y includes N memory cells MC which are electrically connected in serial. N word lines WL_1~WL_N are horizontally disposed. The gate terminals of the memory cells MC, which are electrically connected to the same word line, are physically located on the same plane. For example, the memory cells with their gate terminals being electrically connected to the word line WL_n are physically located at the same plane, regardless of which of the sub-blocks the memory cells belong to.

Furthermore, a couple of dummy word lines dmy_WL are provided. Some of the dummy word lines dmy_WL are provided between the source selection line SSL and the word line W_LN, and some of the dummy word lines dmy_WL are provided between the word line WL_1 and the ground selection line GSL.

For the sake of illustration, the memory cells are represented in a coordinate representation manner. During a programming procedure, a memory cell SMC which is the n-th memory cell being electrically connected to the word line WL_n and located at the y-th memory string st_y of the x-th sub-bock is at the selected state.

When the memory cell SMC, which is at the selected state, is selected for programming, the gate terminal of the memory cell SMC, which is at the selected state, being electrically connected to the word line WL_n, which is at the selected state, receives the programming voltage (for example, 20V), and the gate terminals of the memory cells MC, which is at the deselected state, being electrically connected to the word line WL_1~WL_(n−1), WL_(n+1) ~WL_N, which are at the deselected state, all receive the same pass voltage Vpass (for example, 10V). Once the programming voltage Vpgm greatly changes, the channel may be affected through the word line WL_n, which is at the selected state, and then the channel may affect the pass voltages Vpass. Once the pass voltages Vpass greatly change, the channel may be affected through the word line WL_1~WL_(n−1), WL_(n+1)~WL_N, which are at the deselected state, and then the channel may affect the programming voltage Vpgm.

Based on the above illustration, performing the write command should concern about the interferences between programming voltage Vpgm and the pass voltages Vpass.

SUMMARY

The disclosure is directed to a memory device and a programming method thereof. Based on the programming method, the word lines, which are at the deselected state, are respectively supplied with different voltage waveforms according to their physical positions. With the position changes of the word line, which is at the selected state, the word lines, which are at the deselected state, are set with voltage waveforms having different voltage levels and timing settings. The supplement of different voltage waveforms to various word lines, which are at the deselected state, collectively contributes the desired effect on the word line, which is at the selected state, for programming.

According to one embodiment, a memory device is provided. The memory device includes a memory array, a plurality of word lines and a voltage generator. The memory array includes a plurality of memory cells. The word lines are respectively electrically connected to the memory cells. During a programming procedure, one of the word lines is at a selected state and others of the word lines are at a deselected state. Some of the word lines, which are at the deselected state, are classified into a first group and a second group. The first group and the second group are respectively located two sides of the word line, which is at the selected state. The voltage generator is electrically connected to the memory array. The voltage generator provides a programming voltage to the word line, which is at the selected state, during a programming duration. The voltage generator provides a first two-stage voltage waveform including a first preliminary voltage during a first preliminary duration and a first step voltage during a first step duration to the word lines, which are at the deselected state, in the first group. The voltage generator provides a second two-stage voltage waveform including a second preliminary voltage during a second preliminary duration and a second step voltage during a second step duration to the word lines, which are at the deselected state, in the second group.

According to another embodiment, a programming method applied to a memory device comprising a plurality of word lines and a memory array comprising a plurality of memory cells is provided. During a programing procedure, one of the word lines is at a selected state and others of the word lines are at a deselected state. Some of the word lines, which are at the deselected state, are classified into a first group and a second group. The first group and the second group are respectively located at two sides of the word line, which is at the selected state. The programming method comprises steps of: providing a programming voltage to the word line, which is at the selected state, during a programming duration; providing a first two-stage voltage waveform including a first preliminary voltage during a first preliminary duration and a first step voltage during a first step duration to the word lines, which are at the deselected state, in the first group; and providing a second two-stage voltage waveform including a second preliminary voltage during a second preliminary duration and a second step voltage during a second step duration to the word lines, which are at the deselected state, in the second group.

BRIEF DESCRIPTION OF THE DRAWINGS

FIGS. 6A, 6B, 6C, 6D, and 6E are schematic diagrams illustrating the memory cells in FIG. 3 being alternatively selected for programming.

Figure 1A:
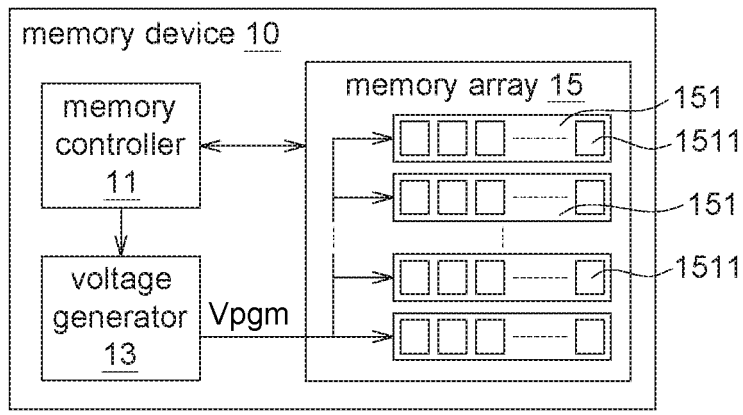
FIG. 1A (prior art) is a block diagram illustrating an electronic device using a memory device.
Figure 1B:
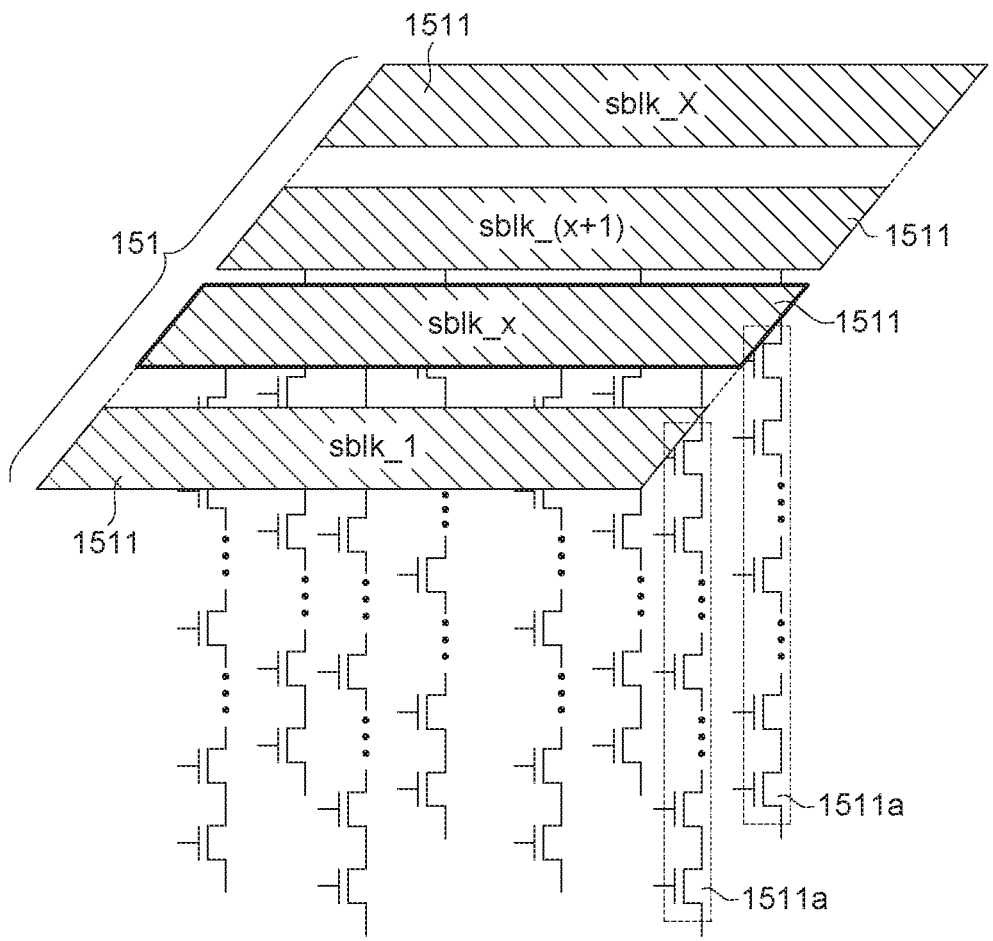
FIG. 1B (prior art) is a schematic diagram illustrating a memory block.
Figure 2:
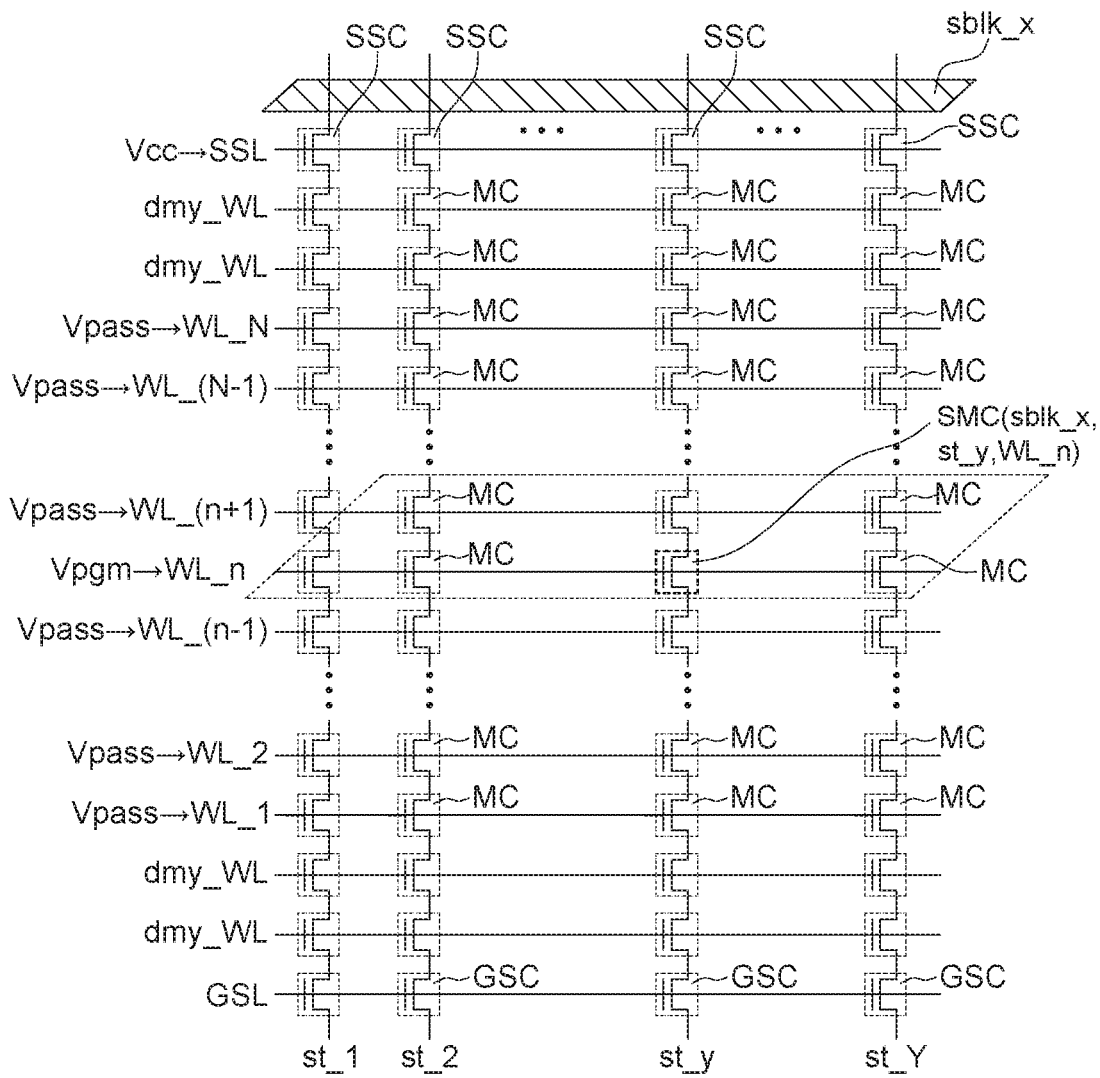
FIG. 2 (prior art) is a schematic diagram illustrating a sub-block.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

To accurately and efficiently program the memory cell, which is at the selected state, a programming method applied to the memory device is provided. With the programming method, the voltage generator provides different voltage waveforms to different word lines. For illustration purposes, an example of the memory strings connected to 5 word lines is illustrated as an example.

Figure 3:
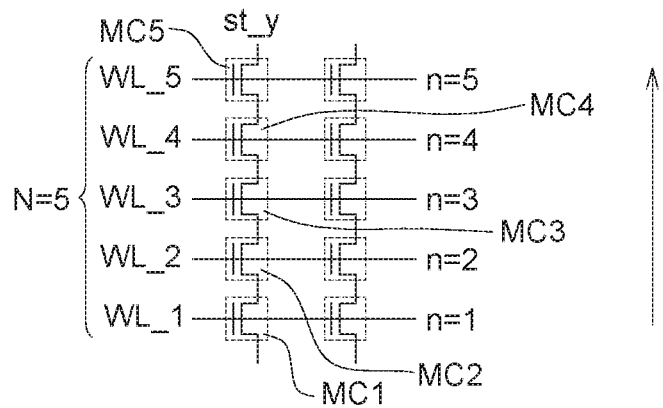
FIG. 3 is a schematic diagram assuming that memory cells are connected to five word lines.

FIG. 3 is a schematic diagram assuming that memory cells are connected to five word lines (N=5). The memory strings st_y includes five memory cells MC1~MC5, which are respectively electrically connected to word lines WL_1~WL_5.

When a memory cell is selected for programming, the word line, being electrically connected to the memory cell, is defined as the word line WL_n, which is at the selected state. Any of the word lines WL_1~WL_5 might be utilized as the word line WL_n, which is at the selected state, depending on the physical location of the memory cell being selected for programming.

The arrow represents the programming sequence. The memory cells MC1~MC5 are separately and gradually programmed through their corresponding word lines WL_1~WL_5. During a programming duration Tpgm (shown in FIG. 4), the word line WL_n, which is at the selected state, receives the programming voltage Vpgm (shown in FIG. 4) from the voltage generator. Thus, the memory cell SMC, which is at the selected state, is turned on. In addition to the memory cell SMC, which is at the selected state, the memory cells which are located at the memory string, which is at the selected state, and electrically connected to the word lines WL_1~WL_(n−1), WL_(n+1)~WL_N, which are at the deselected state, should be turned on to conduct current flowing along the memory string, which is at the selected state. Two types of voltage waveforms can be utilized by the word lines WI_1~WL_(n−1), WL_(n+1)~WL_N, which are at the deselected state, are introduced in FIGS. 4 and 5.

Figure 4:
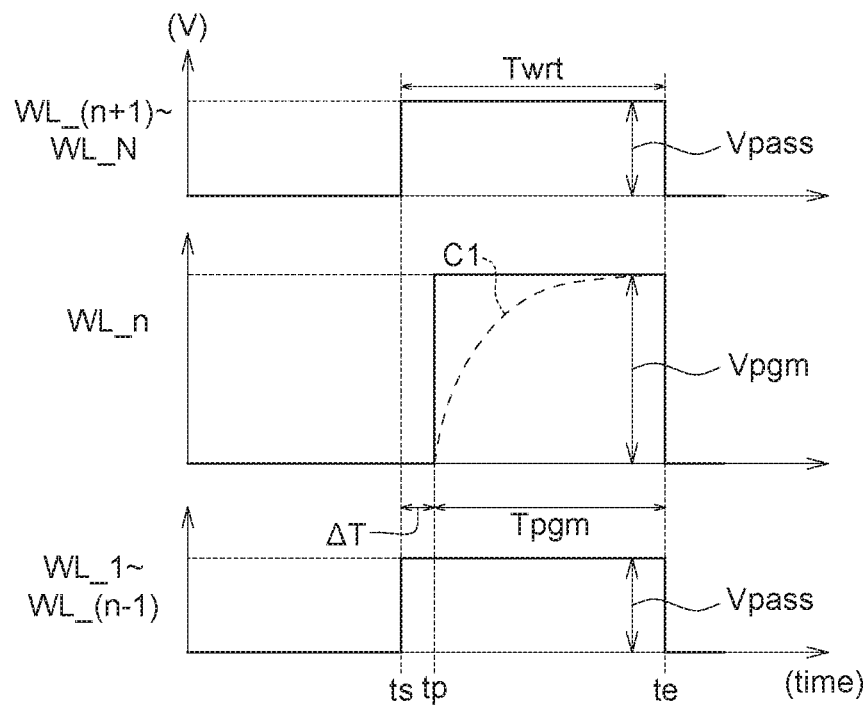
FIG. 4 is a schematic diagram illustrating how the voltage of the word line, which is at the selected state, changes when the word lines, which are at the deselected state, are provided with one-stage voltage waveform.
Figure 5:
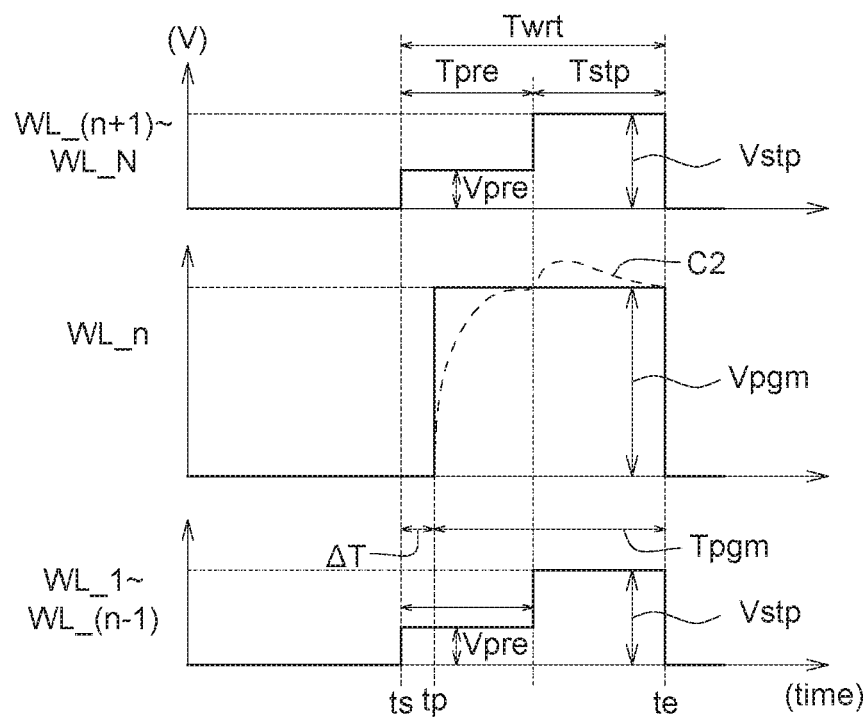
FIG. 5 is a schematic diagram illustrating how the voltage of the word line, which is at the selected state, changes when the word lines, which are at the deselected state, are provided with the two-stage voltage waveform.

In FIGS. 4 and 5, the voltage waveforms being applied to the word lines WL_n, which is at the selected state, and the word lines WL_1~WL_(n−1), WL_(n−1)~WL_N, which are at the deselected state, are shown. In FIGS. 4 and 5, a programming duration Tpgm and a write duration Twrt are defined. The programming duration Tpgm starts at the time point tp, and ends at the time point te. The write duration Twrt starts at the time point ts and ends at the time point te. Thus, there is a time difference ΔT between the write duration Twrt and the programming duration Tpgm (ΔT=Twrt-Tpgm=tp-ts).

FIG. 4 is a schematic diagram illustrating how the voltage of the word line WL_n, which is at the selected state, changes when the word lines WL_1~WL_(n−1), WL_(n+1)~WL_N, which are at the deselected state, are provided with one-stage voltage waveform including the pass voltages Vpass during the write duration Twrt. In FIG. 4, the word line WL_n, which is at the selected state, is provided with the programming voltage Vpgm (for example, 20V) during the programming duration Tpgm; and the word lines) WL_1~WL_(n−1), WL_(n+1)~WL_N, which are at the deselected state, are provided with a pass voltage Vpass (for example, 10V) during the write duration Twrt.

The curve C1 shows that the actual voltage level received by the gate terminal of the word line WL_n, which is at the selected state. As the word line WL_n, which is at the selected state, is collectively shared by memory cells in different memory strings and sub-blocks, the curve C1 does not immediately rise from ground voltage to the programming voltage Vpgm. Instead, the curve C1 slowly rises from 0V to the programming voltage Vpgm. Such slow changes of the word line WL_n, which is at the selected state, may result in programming failure of the memory cell SMC, which is at the selected state.

FIG. 5 is a schematic diagram illustrating how the voltage of the word line WL_n, which is at the selected state, changes when the word lines WL_1~WL_(n−1), WL_(n+1)~WL_N, which are at the deselected state, receive the two-stage voltage waveform. In FIG. 5, the word line WL_n, which is at the selected state, is provided with the programming voltage Vpgm, and the word lines WL_1~WL_(n−1), WL_(n+1)~WL_N, which are at the deselected state, are provided with a two-stage voltage waveform, including a preliminary voltage Vpre (for example, 4V) during a preliminary duration Tpre and a step voltage Vstp (for example, 10V) during a step duration Tstp.

The curve C2 shows that the actual voltage level received by the gate terminal of the word line WL_n, which is at the selected state. Apparently, the adoption of the two-stage voltage waveform can accelerate the raising in the curve C2. However, the curve C2 is higher than the programming voltage Vpgm during the step duration Tstp. Such an overshoot phenomenon is undesired as it may result in a breakdown of the memory cell SMC, which is at the selected state.

The one-stage voltage waveform as shown in FIG. 4, and the two-stage voltage waveform shown in FIG. 5 bring different effects to the word line WL_n, which is at the selected state. According to the present disclosure, a programming method combining the one-stage voltage waveform and the two-stage voltage waveform is provided. The programming method comprehensively considers the potential effects among the word lines WL_n, which is at the selected state, and the word lines WL_1~WL_(n−1), WL_(n+1)~WL_N, which are at the deselected state, and dynamically assigns suitable voltage settings to the voltage generator.

FIGS. 6A, 6B, 6C, 6D, and 6E are schematic diagrams illustrating the memory cells MC1-MC5 in FIG. 3 are alternatively selected for programming. In FIGS. 6A-6E, the thick lines indicate the word line (n=1-5), which is at the selected state.

When the flash memory performs the write command, data are programmed in bottom-up order. That is, the memory cell, being electrically connected to the word line WL_1, is programmed prior to the memory cell being electrically connected to the word line WL_2, and so forth. In other words, FIGS. 6A-6E are performed chronologically. According to the embodiment of the present disclosure, how the voltages are provided to the word lines WL_1~WL_5 is related to the location of the memory cell, which is at the selected state.

Figure 7:
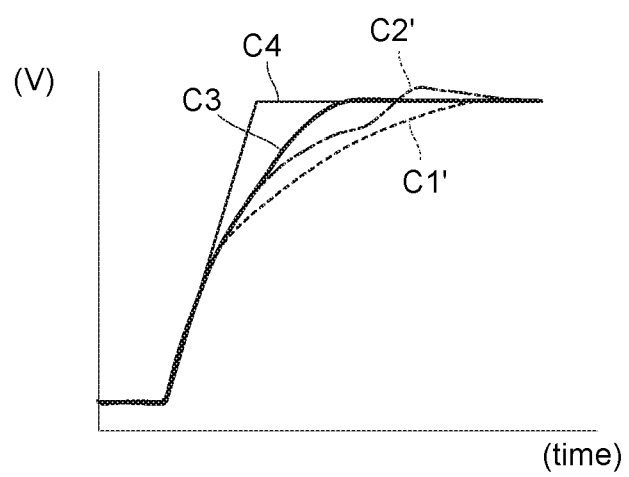
FIG. 7 is a schematic diagram illustrating the combined effect of the word line, which is at the selected state, based on the consideration of control of the word lines.

FIG. 7 is a schematic diagram illustrating the combined effect of the word line, which is at the selected state, based on the consideration of control of the word lines. The curves C1', C2' are respectively corresponding to the curve C1 in FIG. 4 and the curve C2 in FIG. 5. The curve C3 represents the actual voltage changes received by the memory cell SMC, which is at the selected state, under the programming method combining the one-stage voltage waveform and the two-stage voltage waveform. The curve C4 shows how the voltage generator provides the programming voltage Vpgm to the word line WL_n, which is at the selected state.

Comparing with the curves C1', C2', the curve C3 is much closer to the curve C4. Therefore, the dynamically adjusted voltages of word lines can provide better control of the word line WL_n, which is at the selected state.

To further illustrate the programming method according to the embodiment of the present disclosure, a complete voltage waveform diagram summarizing the control mechanism of the word lines WL_n, which is at the selected state, and the word lines WL_1~WL_(n−1), WL_(n+1)~WL_N, which are at the deselected state, is demonstrated.

Figure 8:
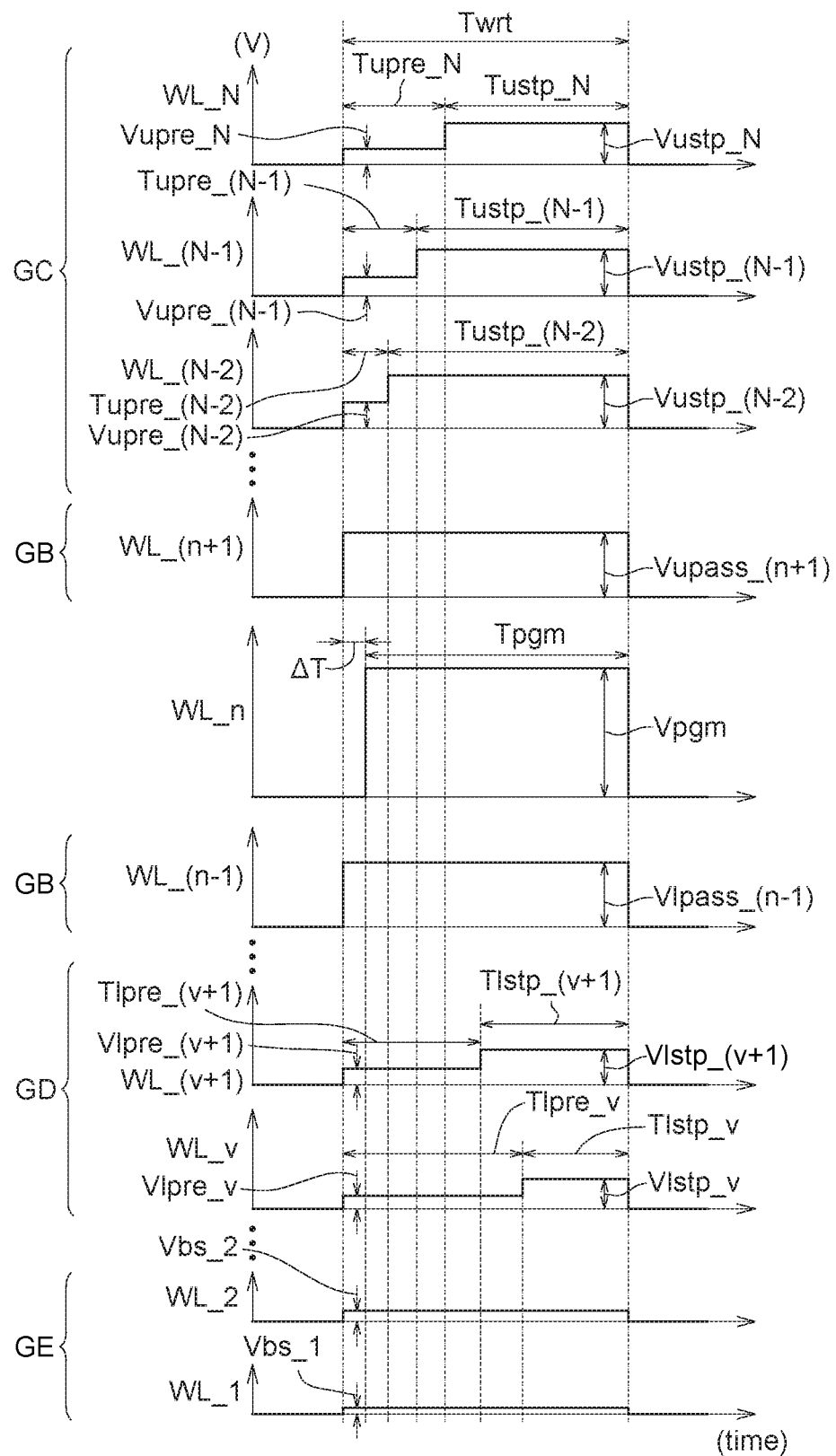
FIG. 8 is a schematic diagram illustrating the N voltage waveforms applied to the N word lines.

FIG. 8 is a schematic diagram illustrating the N voltage waveforms applied to the N word lines. In FIG. 8, the symbol v is a positive integer greater than 2 and smaller than n.

In FIG. 8, the word lines WL_n, which is at the selected state, and the word lines WL_1~WL_(n−1), WL_(n+1)~WL_N, which are at the deselected state, are shown. The word lines WL_1~WL_(n−1), WL_(n+1)~WL_N, which are at the deselected state, can be classified into a first group GC, a second group GD, a third group GB, and a fourth group GE. The first group GC and the second group GD are respectively located at two sides of the word line WL_n, which is at the selected state. The third group GB is adjacent to the two sides of the word line WL_n, which is at the selected state. The fourth group GE is adjacent to the second group GD and close to the source line.

As illustrated above, locations of the word line WL_n, which is at the selected state, are shifted in ascending order. Thus, physical locations of the word line WL_n, which is at the selected state, vary in different write durations Twrt, and the compositions of the first group GC, the second group GD, the third group GB and the fourth group GE are changed with different write duration Twrt.

For the word line WL_(n+1), which are at the deselected state, a one-stage voltage waveform including a pass voltage Vupass_(n+1) during the write duration Twrt is provided. For the word line WL_(N−2), which are at the deselected state, a two-stage voltage waveform including a preliminary voltage Tupre_(N−2) during a preliminary duration Vupre_(N−2) and a step voltage Vustp_(N−2) during a step duration Tustp_(N−2) is provided. The preliminary duration Tupre_(N−2) is shorter than the step duration Tustp_(N−2). For the word line WL_(N−1), which are at the deselected state, a two-stage voltage waveform including a preliminary voltage Vupre_(N−1) during a preliminary duration Tupre_(N−1) and a step voltage Vustp_(N−1) during a step duration Tustp_(N−1) is provided. The preliminary duration Tupre_(N−1) is shorter than the step duration Tstp_(N−1). For the word line WL_N, which are at the deselected state, a two-stage voltage waveform including a preliminary voltage Vupre_N during a preliminary duration Tupre_N and a step voltage Vustp_N during a step duration Tustp_N is provided. The preliminary duration Tupre_N is shorter than the step duration Tustp_N.

Each of the word lines WL_N, WL_(N−1), WL_(N−2), which are at the deselected state, includes two sub-durations, the preliminary durations Tupre_N, Tupre_(N−1), Tupre_(N−2) during which the preliminary voltages Vupre_N, Vupre_(N−1), Vupre_(N−2) are received, and the step durations Tustp_N, Tustp_(N−1), Tustp_(N−2) during which the step voltages Vustp_N, Vustp_(N−1), Vustp_(N−2) are received.

The preliminary durations Tupre_N, Tupre_(N−1), Tupre_(N−2) corresponding to the word lines WL_N, WL_(N−1), WL_(N−2), which are at the deselected state, have the relationship of Tupre_N>Tupre_(N−1)>Tupre_(N−2), and the step durations Tustp_N, Tustp_(N−1), Tustp_(N−2) corresponding to the word lines WL_N, WL_(N−1), WL_(N−2), which are at the deselected state, have the relationship of Tustp_N<Tupre_(N−1)<Tupre_(N−2).

The preliminary voltages Vupre_N, Vupre_(N−1), Vupre_(N−2) corresponding to the word lines WL_N, WL_(N−1), WL_(N−2), which are at the deselected state, have the relationship of Vupre_N<Vupre_(N−1)<Vupre_(N−2), and the step voltages Vustp_N, Vustp_(N−1), Vustp_(N−2) corresponding to the word lines WL_N, WL_(N−1), WL_(N−2), which are at the deselected state, have the relationship of Vustp_N ≤Vustp_(N−1)<Vustp_(N−2).

For the word line WL_(n−1), which are at the deselected state, a one-stage voltage waveform including a pass voltage Vlpass_(n−1) during the write duration Twrt is provided from the voltage generator. For the word line WL_(v+1), which are at the deselected state, a two-stage voltage waveform including a preliminary voltage Vlpre_(v+1) during a preliminary duration Tlpre_(v+1) and a step voltage Vlstp_(v+1) during a step duration Tlstp_(v+1) is provided. For the word line WL_v, which are at the deselected state, a two-stage voltage waveform including a preliminary voltage Vlpre_v during a preliminary duration Tlpre_v and a step voltage Vlstp_v during a step duration Tlstp_v is provided. The preliminary duration Tlpre_v is longer than the step duration Tlstp_v. For the word lines WL_2, which are at the deselected state, a one-stage voltage waveform including a biased voltage Vbs_2 during the write duration Twrt is provided. For the word lines WL_1, which are at the deselected state, a one-stage voltage waveform including a biased voltage Vbs_1 during the write duration Twrt is provided.

Each of the word lines WL_(v+1), WL_v, which are at the deselected state, includes two sub-durations, the preliminary durations Tlpre_(v+1), Tlpre_v during which the preliminary voltages Vlpre_(v+1), Vlpre_v are provided by the voltage generator, and the step durations Tlstp_(v+1), Tlstp_v during which the step voltages Vlstp_(v+1), Vlstp_v are provided by the voltage generator.

The preliminary durations Tlpre_(v+1), Tlpre_v corresponding to the word lines WL_(v+1), WL_v, which are at the deselected state, have the relationship of Tlpre_(v+1)<Tlpre_v, and the step durations Tlstp_(v+1), Tlstp_v corresponding to the word lines WL_(v+1), WL_v, which are at the deselected state, have the relationship of Tstp_(v+1)>Tlstp_v.

The preliminary voltages Vlpre_(v+1), Vlpre_v corresponding to the word lines WL_(v+1), WL_v, which are at the deselected state, have the relationship of Vlpre_(v+1)>Vlpre_v, and the step voltages Vlstp_(v+1), Vlstp_v corresponding to the word lines WL_(v+1), WL_v, which are at the deselected state, have the relationship of Vstp_(v+1)≥Vlstp_v.

Relatively, the word lines WL_2, WL_1, which are at the deselected state and physically below the word line WL_v, which are at the deselected state, constantly and respectively receive the biased voltages Vbs_2, Vbs_1 during the write duration Twrt. The biased voltage Vbs_2 is higher than the biased voltage Vbs_1.

For the word lines WL_1-WL(n−1), WL_(n+1)~WL_N, which are at the deselected state, two types of voltage waveforms are provided. That is, at least one of the word lines WL_1-WL(n−1), WL_(n+1)~WL_N, which are at the deselected state, is provided with the one-stage voltage waveform, and at least one the word lines WL_1-WL(n−1), WL_(n+1)~WL_N, which are at the deselected state, is with the two-stage voltage waveform.

In FIG. 8, it is assumed that N types of voltage waveforms are respectively applied to the N word lines. However, in practical application, types of voltage waveforms provided by the voltage generator might be reduced due to the capability and cost consideration.

Figure 9:
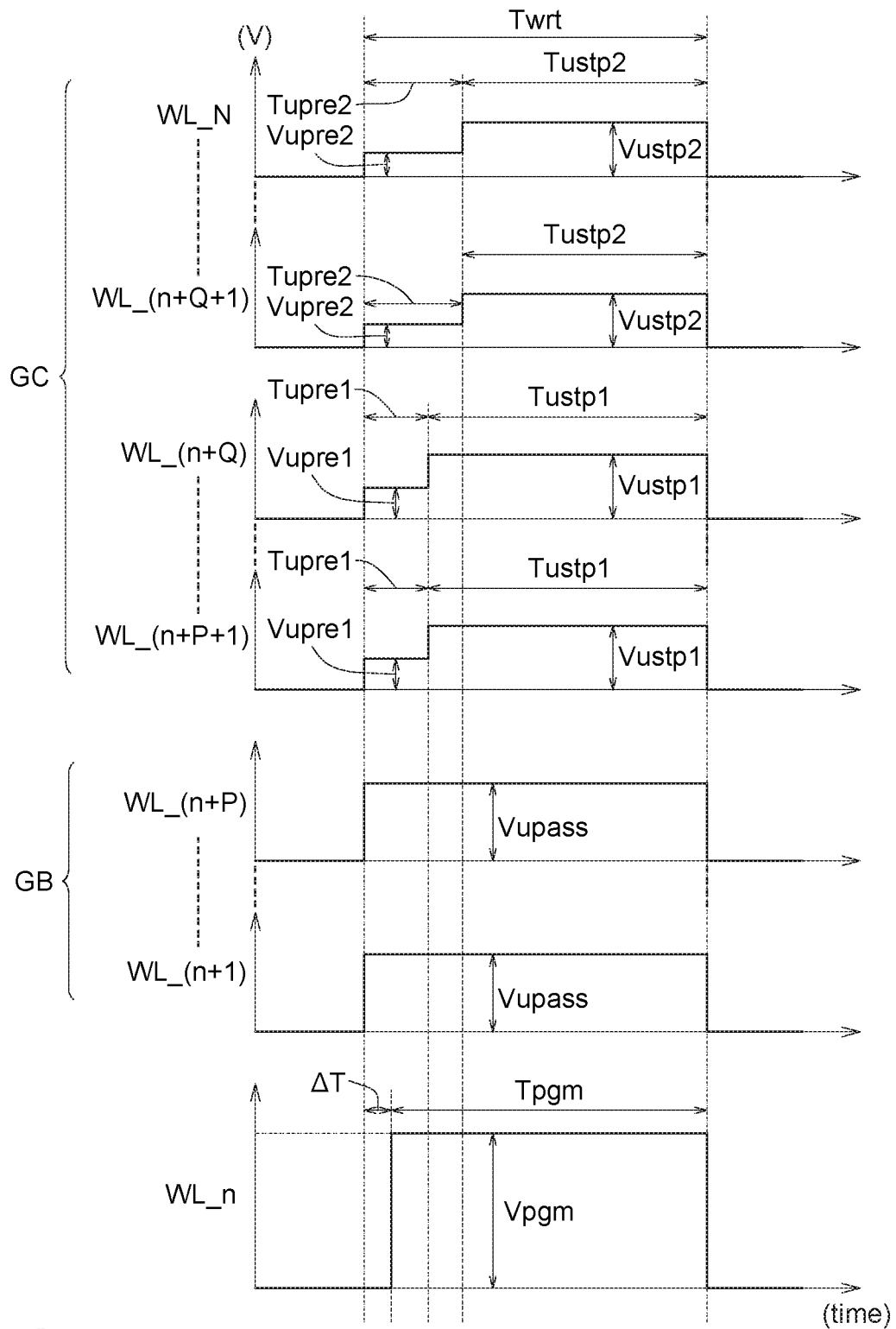
FIG. 9 is a schematic diagram illustrating voltage waveforms corresponding to the word lines, which are at the deselected state, above the word line, which is at the selected state.

FIG. 9 is a schematic diagram illustrating voltage waveforms corresponding to the word lines, which are at the deselected state, above the word line, which is at the selected state. The symbols Q and P are positive integers, and Q>P.

The voltage waveforms shown in FIG. 9 are illustrated in a bottom-up order, starting from the word line WL_n, which is at the selected state, to the upper most word line WL_N, which are at the deselected state. The word line WL_n, which is at the selected state, is provided with the programming voltage Vpgm during the programming duration Tpgm.

Above the word line WL_n, which is at the selected state, the word lines WL_(n+1)~WL_N, which are at the deselected state, are classified into the third group GB and the first group GC. The third group GB includes the word lines WL_(n+1)~WL_(n+P), which are at the deselected state, that are adjacent to and above the word line WL_n, which is at the selected state. The first group GC includes the word lines WL_(n+P+1)~WL_N, which are at the deselected state and above the third group GB.

The word lines WL_(n+1)~WL_(n+P), which are at the deselected state, receive identical voltage waveforms. Each of the word lines WL_(n+1)~WL_(n+P), which are at the deselected state, is provided with the one-stage voltage waveform including a pass voltage Vupass (for example, 10V) during the write duration Twrt. The pass voltage Vupass is lower than the programming voltage Vpgm. As the word lines WL_(n+1)~WL_(n+P), which are at the deselected state, are relatively close to the word line WL_n, which is at the selected state, providing the pass voltage Vupass to the word lines WL_(n+1)~WL_(n+P), which are at the deselected state, can prevent dramatic voltage change surround the word line WL_n, which is at the selected state. Therefore, the voltage levels of the word line WL_n, which is at the selected state, and its nearby word lines WL_(n+1)~WL(n+P), which are at the deselected state, change gradually, and such mechanism can prevent from causing hot carrier injections.

Each of the word lines WL_(n+P+1)~WL_(n+Q), which are at the deselected state, is provided with the two-stage voltage waveform including a preliminary voltage Vupre1 during the preliminary duration Tupre1 and a step voltage Vustp1 during the step duration Tustp1. The preliminary voltage Vupre1 is lower than the step voltage Vustp1, and the preliminary duration Tupre1 is shorter than the step duration Tustp1. Moreover, the step voltage Vustp1 can be lower than or equivalent to the pass voltage Vupass.

Each of the word lines WL_(n+Q+1)~WL_N, which are at the deselected state, is provided with the two-stage voltage waveform including a preliminary voltage Vupre2 during the preliminary duration Tupre2 and a step voltage Vustp2 during the step duration Tustp2. The preliminary voltage Vupre2 is lower than the step voltage Vustp2, and the preliminary duration Tupre2 is shorter than the step duration Tustp2. Moreover, the step voltage Vustp2 can be lower than or equivalent to the pass voltage Vupass.

Similar to FIG. 5, the two-stage voltage waveforms adopted in the word lines WL_(n+P+1)~WL_N, which are at the deselected state, can accelerate the rising of the word line WL_n, which is at the selected state. The preliminary durations Tupre1, Tupre2, the step durations Tustp1, Tustp2, the preliminary voltages Vupre1, Vupre2, and the step voltages Vustp1, Vustp2 are specially designed in the specification.

When the preliminary durations Tupre1, Tupre2 are relatively shorter, the step voltages Vustp1, Vustp2 can be higher. That is, when the preliminary durations Tupre1, Tupre2 are relatively shorter, there is still some tolerance for the word line WL_n, which is at the selected state, to reach the programming voltage Vpgm. Meanwhile, the higher step voltages Vustp1, Vustp2, can be utilized to boost the rising speed of the word line WL_n, which is at the selected state, without causing the overshoot.

Comparing with the word lines WL_(n+Q+1)~WL_N, which are at the deselected state, the word lines WL_(n+P+1)~WL_(n+Q), which are at the deselected state, are relatively close to the word line WL_n, which is at the selected state. The influence caused by the word lines WL_(n+P+1)~WL_(n+Q), which are at the deselected state, to the word line WL_n, which is at the selected state, is greater and faster than that caused by the word lines WL_(n+Q+1)~WL_N, which are at the deselected state. Thus, the preliminary duration Tupre1 is shorter than the preliminary duration Tupre2, and the step voltages Vustp1 is higher than the step voltages Vustp2. Moreover, the gradient decrement of the preliminary voltages Vupre1, Vupre2, and the gradient decrement of the step voltages Vustp1, Vustp2, can depress the hot carrier injections as well.

Figure 10:
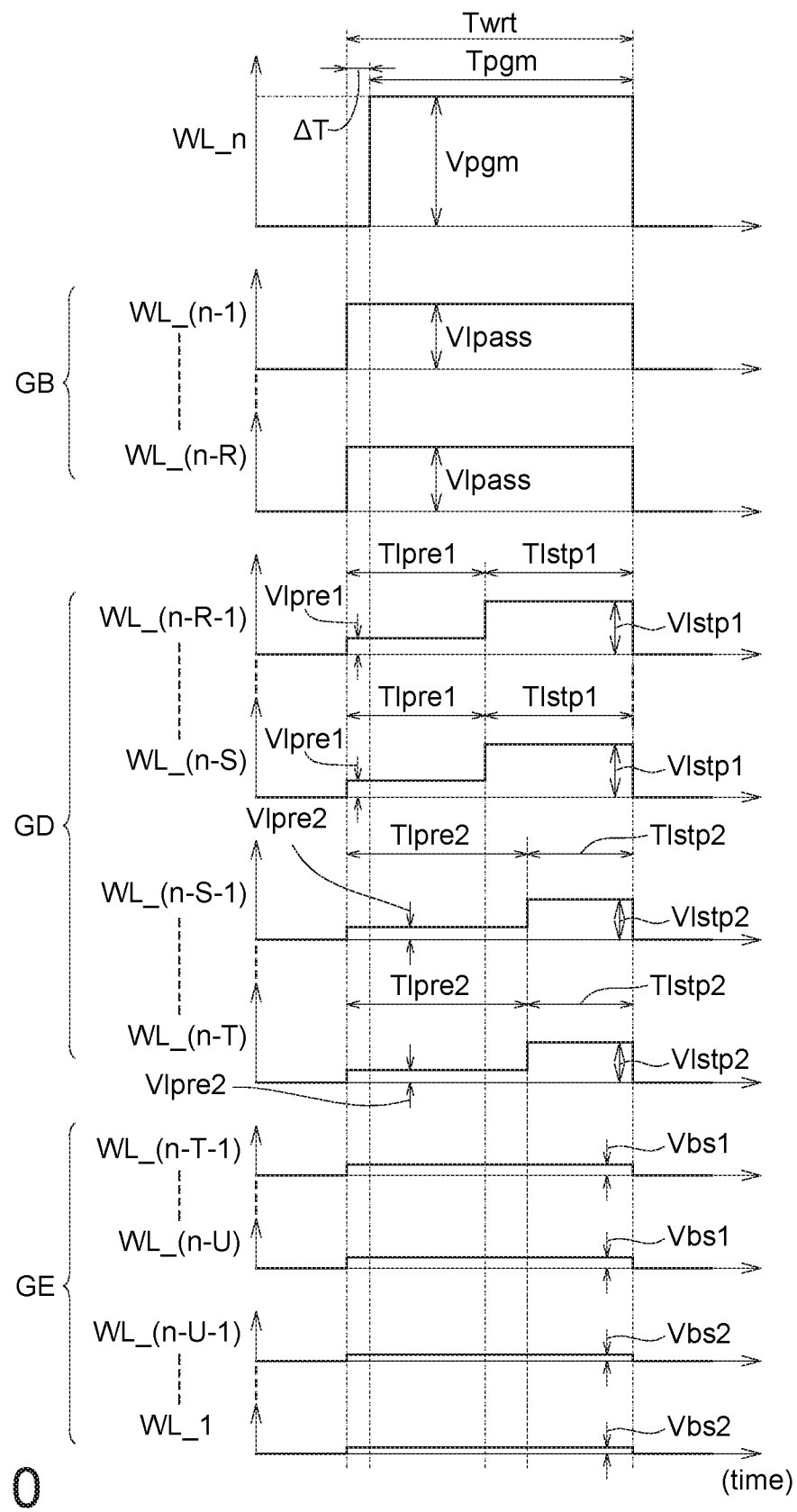
FIG. 10 is a schematic diagram illustrating voltage waveforms corresponding to the word lines, which are at the deselected state, under the word line, which is at the selected state.

FIG. 10 is a schematic diagram illustrating voltage waveforms corresponding to the word lines, which are at the deselected state, under the word line, which is at the selected state. The symbols R, S, T, U are positive integers smaller than n. Moreover, (n−U−1)≥1, and the symbols R, S, T, U have the relationship of R<S<T<U.

The voltage waveforms shown in FIG. 10 are illustrated in top-down order, starting from the word line WL_n, which is at the selected state, to the down most word line WL_1. The word line WL_n, which is at the selected state, is applied with the programming voltage Vpgm during the programming duration Tpgm.

Below the word line WL_n, which is at the selected state, the word lines WL_(n−1)~WL_1, which are at the deselected state, are classified into the third group GB, the second group GD and the fourth group GE. The third group GB includes the word lines WL_(n−1)~WL(n−R) that are at the deselected state and adjacent to and below the word line WL_n, which is at the selected state. The second group GD includes the word lines WL_(n−R−1)~WL_(n−T), which are at the deselected state and below the third group GB. The fourth group GE includes the word lines WL_(n−T−1)~WL_1, which are at the deselected state and relatively close to the source line.

Each of the word lines WL_(n−1)~WL_(n−R), which are at the deselected state, is provided with the one-stage voltage waveform including a pass voltage Vlpass (for example, 10V) during the write duration Twrt. As the word lines WL_(n−1)~WL_(n−R), which are at the deselected state, are relatively close to the word line WL_n, which is at the selected state, providing the pass voltage Vlpass to the word lines WL_(n−1)~WL_(n−R), which are at the deselected state, can prevent dramatic voltage change surround the word line WL_n, which is at the selected state. Therefore, the voltage levels of the word line WL_n, which is at the selected state, and its nearby word lines WL_(n−1)~WL_(n−R), which are at the deselected state, change gradually, and such mechanism can prevent from causing hot carrier injections.

Each of the word lines WL_(n−R−1)~WL_(n−S), which are at the deselected state, is provided with the two-stage voltage waveform including a preliminary voltage Vlpre1 during the preliminary duration Tpre1 and a step voltage Vstp1 during the step duration Tlstp1. The preliminary voltage Vlpre1 is lower than the step voltage Vlstp1.

Each of the word lines WL_(n−S−1)~WL_(n−T), which are at the deselected state, is provided with the two-stage voltage waveform including a preliminary voltage Vpre2 during the preliminary duration Tlpre2 and a step voltage Vlstp2 during the step duration Tstp2. The preliminary voltage Vlpre2 is lower than the step voltage Vstp2, and the preliminary duration Tlpre2 is longer than the step duration Tstp2.

Similar to FIG. 5, the two-stage voltage waveforms adopted in the word lines WL_(n−R−1)~WL_(n−T), which are at the deselected state, can accelerate the rising of the word line WL_n, which is at the selected state. The preliminary durations Tlpre1, Tlpre2, the step durations Tlstp1, Tstp2, the preliminary voltages Vlpre1, Vlpre2, and the step voltages Vlstp1, Vstp2 are specially designed in the specification.

When the preliminary durations Tlpre1, Tlpre2 are relatively shorter, the step voltages Vlstp1, Vlstp2 can be higher. That is, when the preliminary durations Tlpre1, Tlpre2 are relatively shorter, there is still some tolerance time for the word line WL_n, which is at the selected state, to reach the programming voltage Vpgm. Meanwhile, the higher step voltages Vlstp1, Vlstp2, can be utilized to boost the rising speed of the word line WL_n, which is at the selected state, without causing the overshoot.

Comparing with the word lines WL_(n−S−1)~WL(n−T), which are at the deselected state, the word lines WL_(n−R−1)~WL_(n−S), which are at the deselected state, are relatively dose to the word line WL_n, which is at the selected state. The influence caused by the word lines WL_(n−R−1)~WL_(n−S), which are at the deselected state, to the word line WL_n, which is at the selected state, is greater and faster than that caused by the word lines WL_(n−S−1)~WL(n−T), which are at the deselected state. Thus, the preliminary duration Tlpre1 is shorter than the preliminary duration Tlpre2, and the step voltages Vlstp1 is higher than the step voltages Vlstp2. Moreover, the gradient decrement of the preliminary voltages Vlpre1, Vlpre2, and the gradient decrement of the step voltages Vlstp1, Vlstp2, can depress the hot carrier injections as well.

Each of the word lines WL_(n−T−1)~WL_(n−U), which are at the deselected state, is provided with the one-stage voltage waveform including a biased voltage Vbs1 during the write duration Twrt. The biased voltage Vbs1 is lower than the preliminary voltage Vlpre2.

Each of the word lines WL_(n−U−1)~WL_1, which are at the deselected state, is provided with the one-stage voltage waveform including a biased voltage Vbs2 during the write duration Twrt. The biased voltage Vbs2 is lower than or equivalent to the biased voltage Vbs1. In some applications, it is possible that the biased voltages Vbs1, Vbs2 are equivalent to V.

To prevent leakage paths formed at these relatively stable memory cells, the biased voltages Vbs1, Vbs2 provided to the word lines WL_(n−T−1)~WL_1, which are at the deselected state, are very low. Alternatively speaking, the memory cells electrically connected to the word lines WL_(n−T−1)~WL_1, which are at the deselected state, are ensured to be cutoff by applying the low biased voltages Vbs1, Vbs2.

As illustrated above, the voltage waveforms provided to the word lines WL_1~WL_(n−1), WL_(n+1)~WL_N, which are at the deselected state, are dynamically adjusted in response to the relative positions between the word line WL_n, which is at the selected state, and each of the word lines WL_1~WL_(n−1), WL_(n+1)~WL_N, which are at the deselected state. With adequate adjustment of the voltage waveforms, the memory cell, which is at the selected state, can be correctly and efficiently programmed.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
   a memory array, comprising a plurality of memory cells;
   a plurality of word lines, respectively electrically connected to the memory cells, wherein during a programming procedure, one of the word lines is at a selected state and others of the word lines are at a deselected state, some of the word lines, which are at the deselected state, are classified into a first group and a second group, and the first group and the second group are respectively located two sides of the word line, which is at the selected state; and
   a voltage generator, electrically connected to the memory array, wherein
   the voltage generator configured to provide a programming voltage to the word line, which is at the selected state, during a programming duration;
   the voltage generator configured to provide a first two-stage voltage waveform including a first preliminary voltage during a first preliminary duration and a first step voltage during a first step duration to the word lines, which are at the deselected state, in the first group;
   the voltage generator configured to provide a second two-stage voltage waveform including a second preliminary voltage during a second preliminary duration and a second step voltage during a second step duration to the word lines, which are at the deselected state, in the second group;
   wherein some of the word lines, which are at the deselected state, are classified into a third group, the third group is adjacent to two sides of the word line, which is at the selected state, the voltage generator configured to provide a first one-stage voltage waveform including a pass voltage to the word lines, which are at the deselected state, in the third group; and
   wherein some of the word lines, which are at the deselected state, are classified into a fourth group, the fourth group is adjacent to the second group and close to a source line, the voltage generator configured to provide a second one-stage voltage waveform including a biased voltage during a write duration to the word lines, which are at the deselected state, in the fourth group.

2. The memory device according to claim 1, wherein the second step voltage provided for the second group is less than the first step voltage provided for the first group.

3. The memory device according to claim 2, wherein the second preliminary duration for the second group is longer than the first preliminary duration for the first group.

4. The memory device according to claim 1, wherein the pass voltage provided for the third group is lower than the programming voltage.

5. The memory device according to claim 1, wherein the first step voltage provided for the first group is less than or equivalent to the pass voltage provided for the third group.

6. The memory device according to claim 1, wherein the second step voltage provided for the second group is less than or equivalent to the pass voltage provided for the third group.

7. The memory device according to claim 1, wherein the biased voltage provided for the fourth group is less than the second step voltage provided for the second group.

8. The memory device according to claim 1, wherein the number of the word lines, which are at the deselected state, in the third group is more than two.

9. The memory device according to claim 1, wherein the number of the word lines, which are at the deselected state, in the fourth group is more than two.

10. A programming method applied to a memory device comprising a plurality of word lines and a memory array comprising a plurality of memory cells, wherein during a programing procedure, one of the word lines is at a selected state and others of the word lines are at a deselected state, some of the word lines, which are at the deselected state, are classified into a first group and a second group, the first group and the second group are respectively located at two sides of the word line, which is at the selected state, and the programming method comprises steps of:
   providing a programming voltage to the word line, which is at the selected state, during a programming duration;
   providing a first two-stage voltage waveform including a first preliminary voltage during a first preliminary duration and a first step voltage during a first step duration to the word lines, which are at the deselected state, in the first group; and
   providing a second two-stage voltage waveform including a second preliminary voltage during a second preliminary duration and a second step voltage during a second step duration to the word lines, which are at the deselected state, in the second group;
   wherein some of the word lines, which are at the deselected state, are classified into a third group, the third group is adjacent to two sides of the word line, which is at the selected state, and the programming method further comprises:

providing a first one-stage voltage waveform including a pass voltage to the word lines, which are at the deselected state, in the third group; and wherein some of the word lines, which are at the deselected state, are classified into a fourth group, the fourth group is adjacent to the second group and close to a source line, and the programming method further comprises:

providing a second one-stage voltage waveform including a biased voltage during a write duration to the word lines, which are at the deselected state, in the fourth group.

11. The programming method according to claim 10, wherein the second step voltage provided for the second group is less than the first step voltage provided for the first group.

12. The programming method according to claim 11, wherein the second preliminary duration for the second group is longer than the first preliminary duration for the first group.

13. The programming method according to claim 10, wherein the pass voltage provided for the third group is lower than the programming voltage.

14. The programming method according to claim 10, wherein the first step voltage provided for the first group is less than or equivalent to the pass voltage provided for the third group.

15. The programming method according to claim 10, wherein the second step voltage provided for the second group is less than or equivalent to the pass voltage provided for the third group.

16. The programming method according to claim 10, wherein the biased voltage provided for the fourth group is less than the second step voltage provided for the second group.

17. The programming method according to claim 10, wherein the number of the word lines, which are at the deselected state, in the third group is more than two.

18. The programming method according to claim 10, wherein the number of the word lines, which are at the deselected state, in the fourth group is more than two.

* * * * *